(12) United States Patent
Liu

(10) Patent No.: US 8,330,500 B2
(45) Date of Patent: Dec. 11, 2012

(54) COMPARATOR

(75) Inventor: Yi-Heng Liu, Taipei (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 117 days.

(21) Appl. No.: 12/954,624

(22) Filed: Nov. 25, 2010

(65) Prior Publication Data

US 2012/0133396 A1 May 31, 2012

(51) Int. Cl.
*H03K 5/24* (2006.01)
*H03F 3/45* (2006.01)

(52) U.S. Cl. .............. 327/66; 327/63; 327/65; 330/252; 330/253; 330/257

(58) Field of Classification Search .................... 327/63, 327/65, 66; 330/252, 253, 257, 261, 288
See application file for complete search history.

(56) References Cited

U.S. PATENT DOCUMENTS

| | | | | |
|---|---|---|---|---|
| 6,456,155 | B2* | 9/2002 | Takai | 327/541 |
| 7,116,181 | B2* | 10/2006 | Bakker | 331/111 |
| 7,755,339 | B2* | 7/2010 | Kojima et al. | 323/280 |
| 2008/0007242 | A1* | 1/2008 | Kojima et al. | 323/311 |

* cited by examiner

*Primary Examiner* — Patrick O'Neill
(74) *Attorney, Agent, or Firm* — Jianq Chyun IP Office

(57) ABSTRACT

A comparator comprises a current mirror, a differential input pair, and a auxiliary circuit. The current mirror has a biasing end coupled to a power voltage, a first end, and a current outputting end coupled to an output node of the comparator. The differential input pair has a first and second input ends for respectively receiving a first voltage and a second voltage, a second and third ends, and a ground end, wherein the third end is coupled to the first end. The auxiliary circuit is coupled between the output node and the second end, and provides a minimum voltage of a comparison result output at the output node. The comparison result is the power voltage when the first voltage is larger than the second voltage, and the comparison result is the minimum voltage when the first voltage is less than the second voltage.

9 Claims, 3 Drawing Sheets

COMPARATOR

BACKGROUND OF THE INVENTION

1. Field of Invention

The present invention generally relates to a comparator, and more particularly to a comparator which reduces oxide stress of an output power stage connected thereto.

2. Description of Prior Art

A comparator is widely used in the semiconductor circuit for various applications. The comparator may be used in the voltage regulator. The voltage regulator comprises a voltage divider circuit, a comparator, and a power MOS transistor. The power MOS transistor is an output power stage connected to the comparator, and controlled by a comparison result of the comparator to provide a voltage from a power voltage to the voltage divider circuit. The voltage divider circuit generates a dividing voltage based on the received voltage provided by the power MOS transistor. The comparator compares the dividing voltage and a reference voltage, and generates the comparison result to control the power MOS transistor, such that the voltage regulation can be achieved.

Referring to FIG. 1, FIG. 1 is a circuit diagram of a conventional comparator. The comparator 10 comprises a differential input pair IN_D_PAIR, a current mirror CM, and an enable switch 11. The comparator 10 compares an input voltages $V_P$ and $V_N$, and correspondingly outputs the comparison result $V_{OUT}$ at an output node thereof. The enable switch 11 is not the essential element of the comparator 10, and may be removed in the other example.

The differential input pair IN_D_PAIR comprises NMOS transistors N1 and N2, wherein gates of the NMOS transistors N1, N2 are respectively connected to a positive input end and a negative input end of the comparator 10 for respectively receiving the input voltages $V_P$ and $V_N$, and sources of the NMOS transistors N1, N2 are coupled to a ground through the enable switch 11.

The current mirror CM comprises PMOS transistors P1 and P2, wherein gates of the PMOS transistors P1 and P2 are connected together and the gates of the PMOS transistors P1 and P2 are coupled to the NMOS transistor N1. Moreover, the PMOS transistors P1 and P2 coupled to a power voltage VDD.

The enable switch 11 is a NMOS transistor N4, wherein a gate of the NMOS transistor N4 is coupled to a control signal $V_{BIAS}$, a drain of the NMOS transistor N4 is coupled to the sources of the NMOS transistors N1, N2, and a source of the NMOS transistor N4 is coupled to the ground. The comparator 10 is turned on when the enable switch 11 is controlled to be short, and the comparator 10 is turned off when the enable switch 11 is controlled to be open, such that the current consumption can be saved when the comparator 10 is not desired to be used.

Please notice here, range of the comparison result $V_{Out}$ in the above example is from 0V through VDD (i.e. $0 \leq V_{OUT} \leq VDD$), and thus the output power stage must endure the power voltage VDD. Regarding the semiconductor process of 3.3V, the power voltage may be 3.6V, and an allowed pass current is specified to be 55 A. Thus the oxide stress of the output power stage is 3.6V/55 A=6.5 MegV/cm, which excesses the specified maximum oxide stress of the semiconductor process of 3.3V, and thus the oxide thickness should be increased via modifying the optical mask during the semiconductor process of 3.3V. However, modifying the optical mask during the semiconductor process of 3.3V causes large mount of extra cost, and this method for preventing the MOS transistor from burning out is not economically. Therefore, designing a comparator for preventing the MOS transistor from burning out without modifying the optical mask is needed.

SUMMARY OF THE INVENTION

The present invention provides a comparator comprising a current mirror, a differential input pair, and a first auxiliary circuit. The current mirror has a biasing end coupled to a power voltage, a first end, and a current outputting end coupled to an output node of the comparator. The differential input pair has a first and second input ends for respectively receiving a first voltage and a second voltage, a second and third ends, and a ground end, wherein the third end of the differential input pair is coupled to the first end of the current mirror. The first auxiliary circuit is coupled between the output node and the second end of the differential input pair, and provides a minimum voltage of a comparison result output at the output node. The comparison result is the power voltage when the first voltage is larger than the second voltage, and the comparison result is the minimum voltage when the first voltage is less than the second voltage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
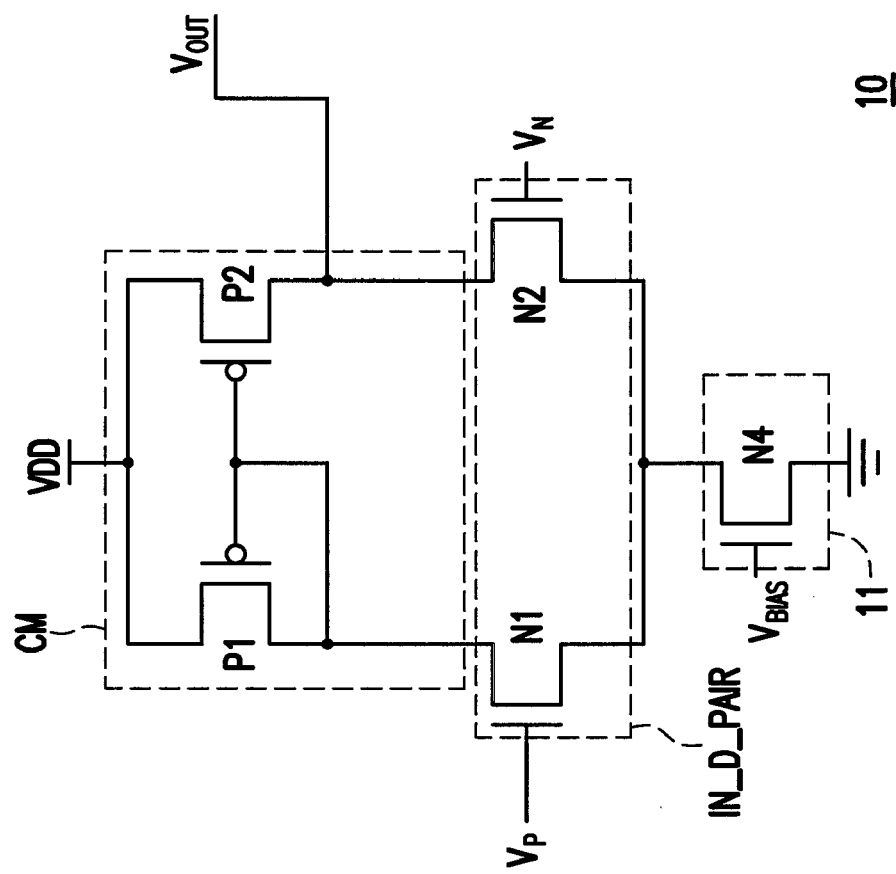
FIG. 1 is a circuit diagram of a conventional comparator.

Reference will now be made in detail to the present preferred embodiment of the invention, examples of which are illustrated in the accompanying drawings. Wherever possible, the same reference numbers are used in the drawings and the description to refer to the same or like parts.

Figure 2:
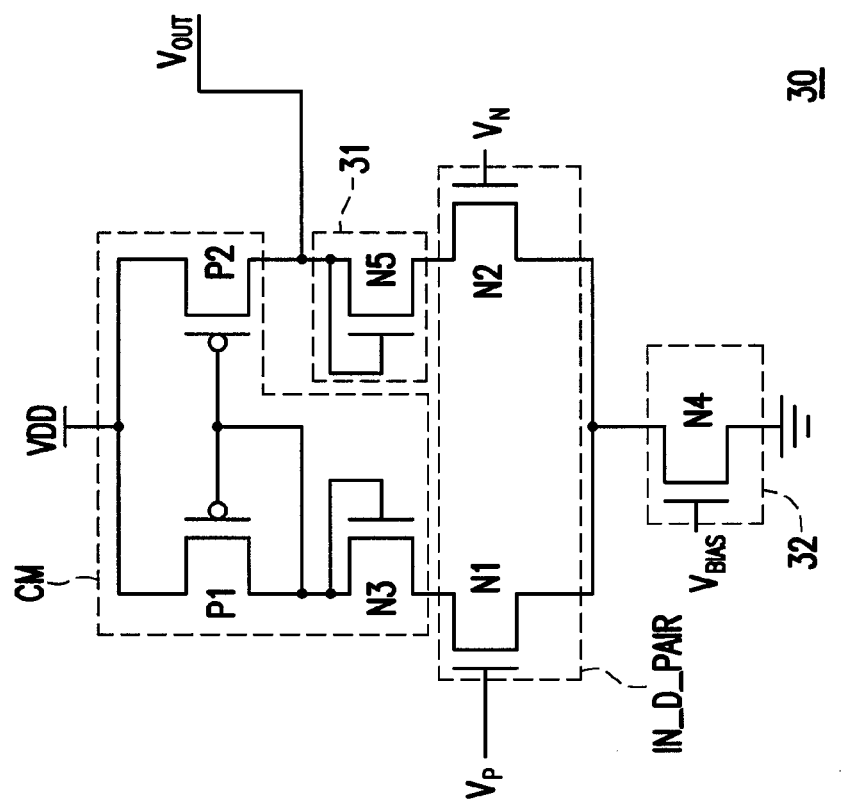
FIG. 2 is a circuit diagram of a comparator according to an embodiment of the present invention.

Referring to FIG. 2, FIG. 2 is a circuit diagram of a comparator according to an embodiment of the present invention. The comparator 30 comprising a current mirror CM, a differential input pair IN_D_PAIR, a auxiliary circuit 31, and an enable switch 32. The current mirror CM has a biasing end coupled to a power voltage VDD, a first end, and a current outputting end coupled to an output node of the comparator 30. The differential input pair IN_D_PAIR has a positive and negative input ends for respectively receiving voltages $V_P$, $V_N$, a second and third ends, and a ground end, wherein the third end of the differential input pair IN_D_PAIR is coupled to the first end of the current mirror CM. The auxiliary 31 circuit is coupled between the output node and the second end of the differential input pair IN_D_PAIR, and provides a minimum voltage of a comparison result $V_{OUT}$ output at the output node. The comparison result $V_{OUT}$ is the power voltage VDD when the voltage $V_P$ is larger than the voltage $V_N$, and the comparison result $V_{OUT}$ is the minimum voltage when the voltage $V_P$ is less than the voltage $V_N$, wherein the minimum voltage is a positive minimum voltage.

The differential input pair IN_D_PAIR comprises NMOS transistors N1, N2, wherein gates of the transistors N1, N2 are respectively coupled to the a first and second input ends, sources of the transistors N1, N2 are coupled to the ground end, and drains of the transistors N1, N2 are respectively coupled to the third and second ends of the differential input pair IN_D_PAIR.

The current mirror comprises a PMOS transistors P1, P2, and a NMOS transistor N3, wherein sources of the PMOS transistors P1, P2 are coupled to the biasing end, gates of the PMOS transistors P1, P2 are coupled to each other, a drain of the PMOS transistor P2 is coupled to the current outputting end, a drain of the PMOS transistor P1 is coupled to the gate of the PMOS transistor P1 and a drain of the NMOS transistor N3, a gate of the NMOS transistor N3 is coupled to the drain of the NMOS transistor N3, and a source of the NMOS transistor N3 is coupled to the first end of the current mirror CM.

The enable switch 32 is coupled between the ground end and a ground, controlled by a control signal $V_{BIAS}$ to provide the ground connected to the ground end. The enable switch is a NMOS transistor N4, wherein a gate of the NMOS transistor N4 is coupled to the control signal $V_{BIAS}$, a drain of the NMOS transistor N4 is coupled to the ground end, and a source of the NMOS transistor N4 is coupled to the ground. When the comparator 30 is not used, the control signal $V_{BIAS}$ controls the NMOS transistor N4 to be turned off, such that the comparator 30 is not enabled, and the undesired current consumption is saved. The enable switch 32 is not the essential element of the comparator 30, and can be removed from the comparator 30.

The auxiliary circuit 31 is a NMOS transistor N5, wherein a drain of the NMOS transistor N5 is coupled to the output node, a gate of the NMOS transistor N5 is coupled to drain of the NMOS transistor N5, and a source of the NMOS transistor N5 is coupled to the second end of the differential input pair IN_D_PAIR. In the embodiment, the minimum voltage of the comparison result Vout is the threshold voltage $V_{th}$ of the NMOS transistor N5, and the threshold voltage $V_{th}$ of the NMOS transistor N5 is generally 0.7V. In the other embodiment, the auxiliary circuit 31 can be a diode or the other element for providing the minimum voltage of the comparison result $V_{OUT}$.

Figure 3:
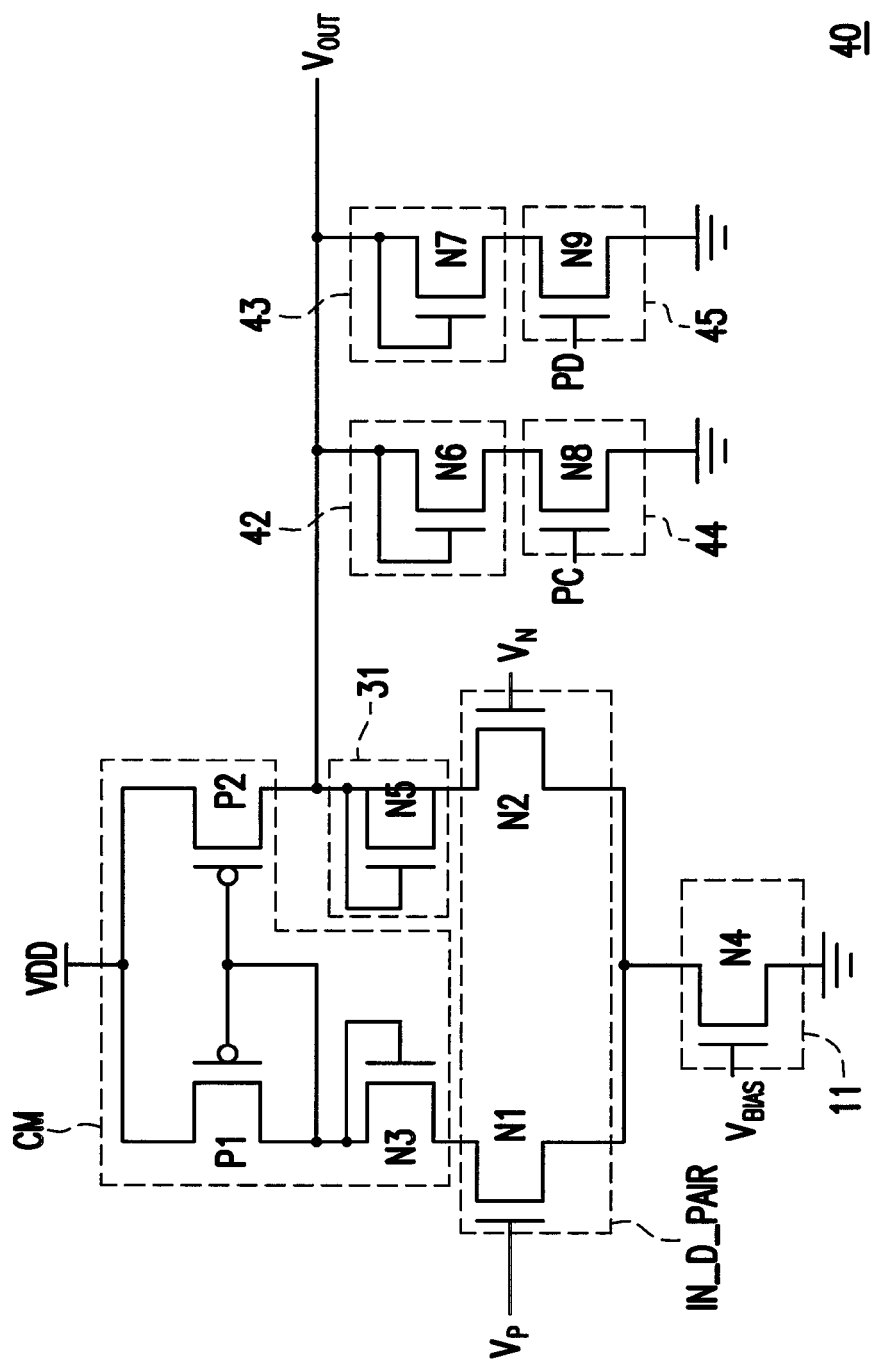
FIG. 3 is a circuit diagram of a comparator according to another embodiment of the present invention.

Referring to FIG. 3, FIG. 3 is a circuit diagram of a comparator according to another embodiment of the present invention. The comparator 40 for example is used for the voltage divider circuit which outputs a pre-kick dividing voltage to the positive input end of the comparator 40, such that the comparator 40 can output the stable comparison result $V_{OUT}$. The comparator 40 is similar to the comparator 30, but further comprises auxiliary circuits 42, 43, and switches 44, 45. The switches 44 and 45 can help the comparator 40 to output the stable comparison result $V_{OUT}$, but since the comparison result $V_{OUT}$ should not be pull down to the ground, the auxiliary circuits 42, 43 should be added to provide the minimum voltage of the comparison result $V_{OUT}$.

The switch 44 is controlled a control signal PC to provide a ground connected to the auxiliary circuit 42. The switch 45 is controlled a control signal PD to provide the ground connected to the auxiliary circuit 43. The auxiliary circuit 42 is coupled between the output node and the switch 44. The auxiliary circuit 43 is coupled between the output node and the switch 45. The auxiliary circuits 31, 42, 43 provide the minimum voltage of the comparison result $V_{OUT}$ output at the output node.

The auxiliary circuits 42, 43 are respectively NMOS transistors N6, N7, wherein drains of the NMOS transistors N6, N7 are coupled to the output node, gates of the NMOS transistors N6, N7 are respectively coupled to the drains of the NMOS transistors N6, N7, and sources of the NMOS transistors N6, N7 are respectively coupled to the switches 44 and 45. In the embodiment, the minimum voltage of the comparison result Vout is the threshold voltage $V_{th}$ of the NMOS transistors N5-N7, and the threshold voltage $V_{th}$ of the NMOS transistors N5-N7 is generally 0.7V. In the other embodiment, the auxiliary circuits 31, 42, and 43 can be diodes or the other elements for providing the minimum voltage of the comparison result $V_{OUT}$.

The switches 44, 45 are respectively NMOS transistors N8, N9, wherein drains of the NMOS transistors N8, N9 are respectively coupled to the auxiliary circuits 42, 43, gates of the NMOS transistors N8, N9 are respectively coupled to the control signals PC, PD, and sources of the NMOS transistors N8, N9 are coupled to the ground.

Range of the comparison result $V_{OUT}$ in the above two embodiment is from $V_{th}$ through VDD (i.e. $V_{th} \leq V_{OUT} \leq VDD$), and thus the output power stage must endure the voltage VDD-$V_{th}$. Regarding the semiconductor process of 3.3V, the voltage VDD-$V_{th}$ may be 2.9V (i.e. 3.6V−0.7V=2.9V, assuming $V_{th}$ is 0.7V), and an allowed oxide thickness is specified to be 55 A. Thus the oxide stress of the output power stage is 2.9V/55 A=5.3 MegV/cm, which is generally less than the specified maximum oxide stress of the semiconductor process of 3.3V. Thus the oxide thickness should not be increased, and modifying the optical mask during the semiconductor process of 3.3V is not needed, therefore saving large mount of extra cost for modifying the optical mask.

To sum up, since the comparison result of the comparator provided by the present invention has the minimum voltage, the oxide stress of an output power stage connected to this comparator can be reduced, such that the oxide thickness of the output power stage should not be increased. Accordingly, regarding some semiconductor process, the optical mask thereof may not be modified, and the oxide stress of an output power stage connected to this comparator can still be allowed, so as to reduce large mount of extra cost for modifying the optical mask.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A comparator comprises:
   a current mirror, having a biasing end coupled to a power voltage, a first end, and a current outputting end coupled to an output node of the comparator;
   a differential input pair, having a first and second input ends for respectively receiving a first voltage and a second voltage, a second and third ends, and a ground end, wherein the third end is coupled to the first end;
   a first auxiliary circuit, coupled between the output node and the second end;
   a first switch, controlled by a second control signal to provide a ground connected to a second auxiliary circuit;
   a second switch, controlled by a third control signal to provide the ground connected to a third auxiliary circuit;
   the second auxiliary circuit, coupled between the output node and the first switch; and
   the third auxiliary circuit, coupled between the output node and the second switch;

wherein the first, second, and third auxiliary circuits provide a minimum voltage of a comparison result output at the output node, wherein the comparison result is the power voltage when the first voltage is larger than the second voltage, and the comparison result is the minimum voltage when the first voltage is less than the second voltage.

2. The comparator according to claim 1, wherein the minimum voltage is a positive minimum voltage.

3. The comparator according to claim 1, wherein the differential input pair comprises a first and second NMOS transistors, wherein gates of the first and second NMOS transistors are respectively coupled to the a first and second input ends, sources of the first and second NMOS transistors are coupled to the ground end, and drains of the first and second NMOS transistors are respectively coupled to the third and second ends.

4. The comparator according to claim 1, wherein the current mirror comprises a first and second PMOS transistors, and a third NMOS transistor, wherein sources of the first and second PMOS transistors are coupled to the biasing end, gates of the first and second PMOS transistors are coupled to each other, a drain of the second PMOS transistor is coupled to the current outputting end, a drain of the first PMOS transistor is coupled to the gate of the first PMOS transistor and a drain of the third NMOS transistor, a gate of the third NMOS transistor is coupled to the drain of the third NMOS transistor, and a source of the third NMOS transistor is coupled to the first end.

5. The comparator according to claim 1, further comprising an enable switch coupled between the ground end and the ground, controlled by a first control signal to provide the ground connected to the ground end.

6. The comparator according to claim 5, wherein the enable switch is a fourth NMOS transistor, wherein a gate of the fourth NMOS transistor is coupled to the first control signal, a drain of the fourth NMOS transistor is coupled to the ground end, and a source of the fourth NMOS transistor is coupled to the ground.

7. The comparator according to claim 1, wherein the first auxiliary circuit is a fifth NMOS transistor, wherein a drain of the fifth NMOS transistor is coupled to the output node, a gate of the fifth NMOS transistor is coupled to drain of the fifth NMOS transistor, and a source of the fifth NMOS transistor is coupled to the second end.

8. The comparator according to claim 1, wherein the second and third auxiliary circuits are respectively a sixth and seventh NMOS transistors, wherein drains of the sixth and seventh NMOS transistors are coupled to the output node, gates of the sixth and seventh NMOS transistors are respectively coupled to the drains of the sixth and seventh NMOS transistors, and sources of the sixth and seventh NMOS transistors are respectively coupled to the first and second switches.

9. The comparator according to claim 1, wherein the first and second switches are respectively a eighth and ninth NMOS transistors, wherein drains of the eighth and ninth NMOS transistors are respectively coupled to the second and third auxiliary circuits, gates of the eighth and ninth NMOS transistors are respectively coupled to the second and third control signals, and sources of the eighth and ninth NMOS transistors are coupled to the ground.

* * * * *